(12) United States Patent
Woo et al.

(10) Patent No.: US 12,131,934 B2
(45) Date of Patent: Oct. 29, 2024

(54) SEMICONDUCTOR SUBSTRATE SUPPORT LEVELING APPARATUS

(71) Applicant: Applied Materials, Inc., Santa Clara, CA (US)

(72) Inventors: Katherine Woo, Santa Clara, CA (US); Paul L. Brillhart, Pleasanton, CA (US); Jian Li, Fremont, CA (US); Shinnosuke Kawaguchi, Adachi-Ku (JP); David W. Groechel, Sunnyvale, CA (US); Dorothea Buechel-Rimmel, Sunnyvale, CA (US); Juan Carlos Rocha-Alvarez, San Carlos, CA (US); Paul E. Fisher, Los Altos, CA (US); Chidambara A. Ramalingam, Fremont, CA (US); Joseph J. Farah, Hollister, CA (US)

(73) Assignee: Applied Materials, Inc., Santa Clara, CA (US)

( * ) Notice: Subject to any disclaimer, the term of this patent is extended or adjusted under 35 U.S.C. 154(b) by 956 days.

(21) Appl. No.: 17/063,334

(22) Filed: Oct. 5, 2020

(65) Prior Publication Data
US 2022/0108907 A1    Apr. 7, 2022

(51) Int. Cl.
*H01L 21/67* (2006.01)
*G01L 9/08* (2006.01)
(Continued)

(52) U.S. Cl.
CPC ............... *H01L 21/68* (2013.01); *G01L 9/08* (2013.01); *H01J 37/32724* (2013.01);
(Continued)

(58) Field of Classification Search
CPC ............... H01L 21/67259; H01L 21/68; H01J 37/32935; H01J 2237/20292
See application file for complete search history.

(56) References Cited

U.S. PATENT DOCUMENTS 5,336,244 A * 8/1994 Weijand ............... A61N 1/3655
                                              607/21
6,244,121 B1 * 6/2001 Hunter ................. H01L 21/681
                                              73/866.5
(Continued)

FOREIGN PATENT DOCUMENTS

KR    20170089672 A  *  1/2016
WO    WO 0019521 A1  *  4/2000

OTHER PUBLICATIONS

Charles et al. (Proceedings of 2003 ASME, IMECHE: International Mechanical Engineering Congress Washington, D.C., USA, Nov. 15-21, 2003 (Year: 2003).*

(Continued)

*Primary Examiner* — Mahdi H Nejad
(74) *Attorney, Agent, or Firm* — Kilpatrick Townsend & Stockton LIP

(57) ABSTRACT

Exemplary semiconductor processing systems may include a chamber body including sidewalls and a base. The chamber body may define an interior volume. The systems may include a substrate support extending through the base of the chamber body. The substrate support may be configured to support a substrate within the interior volume. The systems may include a faceplate positioned within the interior volume of the chamber body. The faceplate may define a plurality of apertures through the faceplate. The systems may include a leveling apparatus seated on the substrate support. The leveling apparatus may include a plurality of piezoelectric pressure sensors.

7 Claims, 4 Drawing Sheets

(51) Int. Cl.
  *H01J 37/32* (2006.01)
  *H01L 21/68* (2006.01)
  *H04Q 9/00* (2006.01)
  *H01L 21/683* (2006.01)

(52) U.S. Cl.
  CPC ...... *H04Q 9/00* (2013.01); *H01J 2237/20264* (2013.01); *H01L 21/67103* (2013.01); *H01L 21/6833* (2013.01); *H01L 21/6838* (2013.01)

(56) References Cited

U.S. PATENT DOCUMENTS

| | | | | |
|---|---|---|---|---|
| 7,994,793 | B2* | 8/2011 | Matsumoto | H01L 21/67259 355/75 |
| 8,149,005 | B2* | 4/2012 | Matsumoto | H01L 21/67259 324/750.16 |
| 2003/0037457 | A1* | 2/2003 | Bailey | H01L 21/67069 34/232 |
| 2004/0137757 | A1* | 7/2004 | Li | H01L 21/02274 438/778 |
| 2008/0295769 | A1* | 12/2008 | Kawagoe | H01L 21/6875 118/696 |
| 2009/0146230 | A1* | 6/2009 | Takizawa | G01L 9/008 257/419 |
| 2010/0251826 | A1* | 10/2010 | Choi | G01L 9/0042 29/25.35 |
| 2011/0281376 | A1* | 11/2011 | Amano | H01L 21/6708 156/345.24 |
| 2015/0376782 | A1* | 12/2015 | Griffin | G01D 5/24 118/712 |
| 2016/0027675 | A1* | 1/2016 | Ravid | C23C 16/45544 118/712 |
| 2016/0315000 | A1* | 10/2016 | Nguyen | H01L 21/67184 |
| 2017/0261312 | A1* | 9/2017 | Khandelwal | G01D 5/34 |
| 2017/0350688 | A1* | 12/2017 | Boyd, Jr. | G01B 11/14 |
| 2019/0360633 | A1* | 11/2019 | Schaller | C23C 16/4584 |
| 2021/0166942 | A1* | 6/2021 | Ma | H01L 21/02115 |
| 2021/0320027 | A1* | 10/2021 | Huang | H01L 21/67017 |
| 2022/0122879 | A1* | 4/2022 | Patil | H01L 21/68792 |
| 2023/0086151 | A1* | 3/2023 | Koh | H01J 37/32522 438/121 |

OTHER PUBLICATIONS

Wireless vs Wired pressure sensor (Year: 2004).*
High-performance textile piezoelectric pressure sensor with novel structural hierarchy based on ZnO nanorods array for wearable application; Yongsong Tan, Kun Yang1, Bo Wang, Hui Li, Lei Wang and Chaoxia Wang; ISSN 1998-0124 (Year: 2021).*
Bioinspired flexible piezoresistive sensor for high-sensitivity detection of broad pressure range; Meng Wang, Hao Zhang, Han Wu2, • Suqian Ma, Lei Ren , Yunhong Liang (Year: 2023).*

* cited by examiner

SEMICONDUCTOR SUBSTRATE SUPPORT LEVELING APPARATUS

TECHNICAL FIELD

The present technology relates to components and apparatuses for semiconductor manufacturing. More specifically, the present technology relates to devices and methods of leveling substrate support assemblies.

BACKGROUND

Integrated circuits are made possible by processes which produce intricately patterned material layers on substrate surfaces. As device sizes continue to shrink in next-generation devices, uniformity of processing conditions continues to increase in importance. Many aspects of processing chamber designs and system set-up may have an important role in the quality of devices produced. Thus, there is a need for improved systems and methods that can be used to produce high quality devices and structures. These and other needs are addressed by the present technology.

SUMMARY

Exemplary semiconductor processing systems may include a chamber body including sidewalls and a base. The chamber body may define an interior volume. The systems may include a substrate support extending through the base of the chamber body. The substrate support may be configured to support a substrate within the interior volume. The systems may include a faceplate positioned within the interior volume of the chamber body. The faceplate may define a plurality of apertures through the faceplate. The systems may include a leveling apparatus seated on the substrate support. The leveling apparatus may include a plurality of piezoelectric pressure sensors.

In some embodiments, each sensor of the plurality of piezoelectric pressure sensors may include an antenna. The systems may include a transmitter disposed outside of the chamber body and configured to transmit an input signal to a transducer of each of the plurality of piezoelectric pressure sensors. The systems may include at least one receiver disposed outside of the chamber body and configured to receive an output signal from an antenna of each of the plurality of piezoelectric pressure sensors. The receiver may be configured to compare an oscillation frequency shift of each sensor of the plurality of piezoelectric pressure sensors. The leveling apparatus may include at least two piezoelectric pressure sensors compressibly coupled between two plates of the leveling apparatus. The piezoelectric pressure sensors may be or include surface acoustic wave pressure sensors.

Some embodiments of the present technology may encompass methods of leveling a pedestal. The methods may include, within a semiconductor processing chamber, raising a substrate support to a position proximate a faceplate. A leveling apparatus may be seated on the substrate support. The leveling apparatus may include at least one piezoelectric pressure sensor. The methods may include heating the substrate support to a temperature above or about 100° C. The methods may include contacting the faceplate with the leveling apparatus. The methods may include receiving a response at a receiver located outside of the semiconductor processing chamber from the at least one piezoelectric pressure sensors. The methods may include determining a parallelism between a surface of the pedestal on which the leveling apparatus is seated and the faceplate.

In some embodiments, the response may include an oscillation frequency of the at least one piezoelectric pressure sensor. The determining may include comparing a shift of the oscillation frequency of the at least one piezoelectric pressure sensor to a baseline oscillation frequency of the at least one piezoelectric pressure sensor. The leveling apparatus may include a plurality of piezoelectric pressure sensors, The determining may include comparing a shift of an oscillation frequency of each piezoelectric pressure sensor to a shift of an oscillation frequency of each other piezoelectric pressure sensor. The methods may include reducing a pressure within the semiconductor processing chamber. The methods may include sending a signal from a transmitter disposed outside of the semiconductor processing chamber to a transducer of the at least one piezoelectric pressure sensor. The leveling apparatus may include at least two piezoelectric pressure sensors compressibly coupled between two plates of the leveling apparatus. The piezoelectric pressure sensors may be or include surface acoustic wave pressure sensors.

Some embodiments of the present technology may encompass leveling apparatuses. The apparatuses may include at least two piezoelectric pressure sensors compressibly coupled between two plates of the leveling apparatus. In some embodiments, the piezoelectric pressure sensors may be or include surface acoustic wave pressure sensors. The piezoelectric pressure sensors may include one or more of lithium niobate, quartz, lithium tantalate, or lanthanum gallium silicate. The two plates may include a ceramic material configured to maintain rigidity at temperatures greater than or about 200° C. The piezoelectric pressure sensors may include one or more antennae configured to communicatively couple with a remote transmitter and a remote receiver.

Such technology may provide numerous benefits over conventional systems and techniques. For example, embodiments of the present technology may provide leveling apparatuses that do not include wire couplings extending form the chamber, and may be utilized in sealed chambers. Additionally, leveling apparatuses according to the present technology may be operable at processing temperatures for improving parallelism with a distributer. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
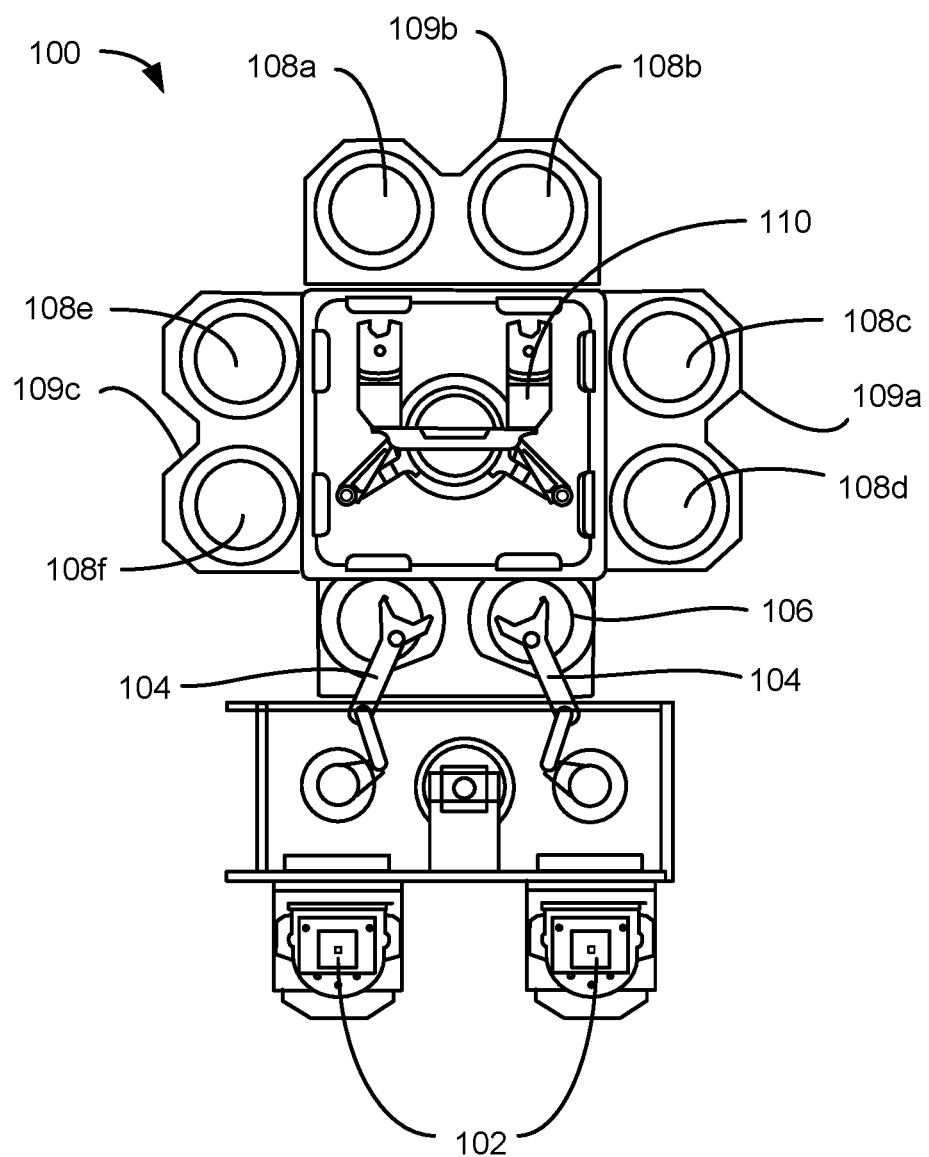
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor processing, etching and/or deposition uniformity may be sensitive to the parallelism between a substrate support in the chamber body, on which a substrate may be placed for processing, and lid stack components through which various processing gases and precursors may be delivered and/or distributed into the chamber and onto the substrate. The degree of parallelism may affect flow patterns of materials being distributed, as well as plasma characteristics for in situ plasma generation.

Some conventional tools may level the pedestal with respect to a faceplate, a distributer, or a top surface of the chamber body under atmospheric conditions. This may be due to several reasons. For example, the device used for leveling may have data wires extending into and out of the chamber, which may require leveling to be performed on an open chamber. Additionally, for some exemplary systems, the lid stack may be hinged to the chamber body and may be opened and closed relative to the chamber body. When the lid stack may be closed, the gas distribution components of the lid stack may not be axially aligned with the chamber body and/or parallel to the top surface of the chamber body. Consequently, the gas distribution components of the lid stack components may not be axially aligned with and/or parallel to the pedestal, affecting processing uniformity. Further, when the chamber pressure may be reduced to vacuum, movement of components during the pumping process may also affect the axial alignment and parallelism between the gas distribution components and the pedestal.

Many semiconductor processes may also be performed at temperatures that far exceed the capabilities of many leveling devices, and which may impact components of the chamber. For example, many semiconductor processes may be performed at temperatures above 200° C. or more, which may pose a danger to an operator attempting to perform leveling operations. However, as temperatures increase, aspects of chamber components may be affected. For example, materials of the pedestal or lid stack components may deform or expand in ways that may affect parallelism identified at room temperature. As semiconductor processing extends to minute processing operations, these slight deformations at high temperatures may affect a degree of parallelism of the substrate being processed in relation to the chamber components. Even if some conventional leveling devices could be used in a closed chamber, most of them include sensitive electronics that are incapable of surviving processing temperatures.

The present technology overcomes these issues by utilizing piezoelectric pressure sensors in a leveling apparatus. The present technology may transmit the measured data wirelessly to a remote computer or receiver for an operator to level the pedestal. The present technology may allow the pedestal of the processing chamber to be leveled under atmospheric or vacuum conditions, as well as at temperatures well above 200° C. By comparing output signals transmitted from multiple sensors, an operator can identify an extent of parallelism between a substrate support and a faceplate or other lid stack component at operating conditions.

Although the remaining disclosure will routinely identify specific chambers utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
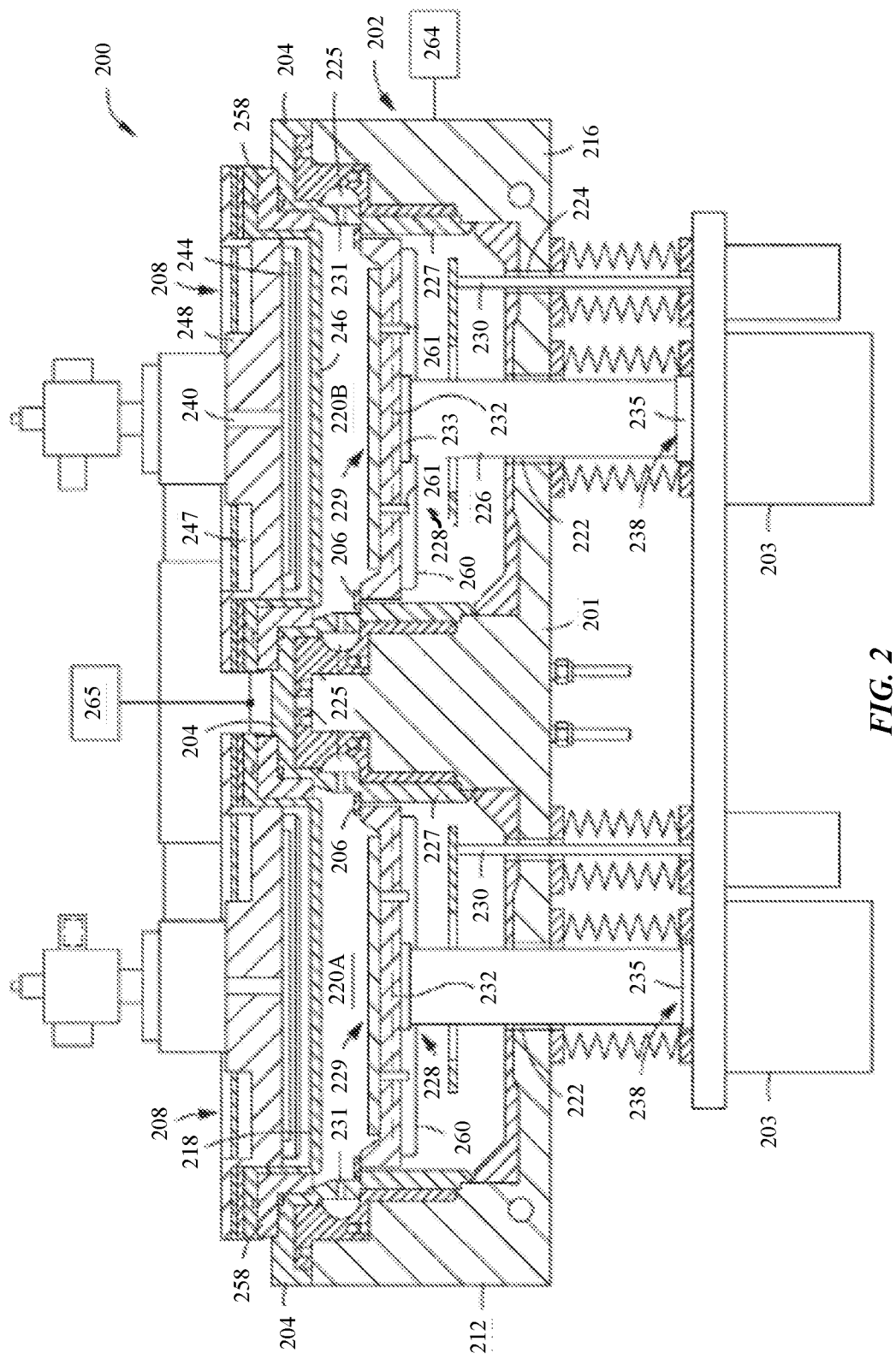
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
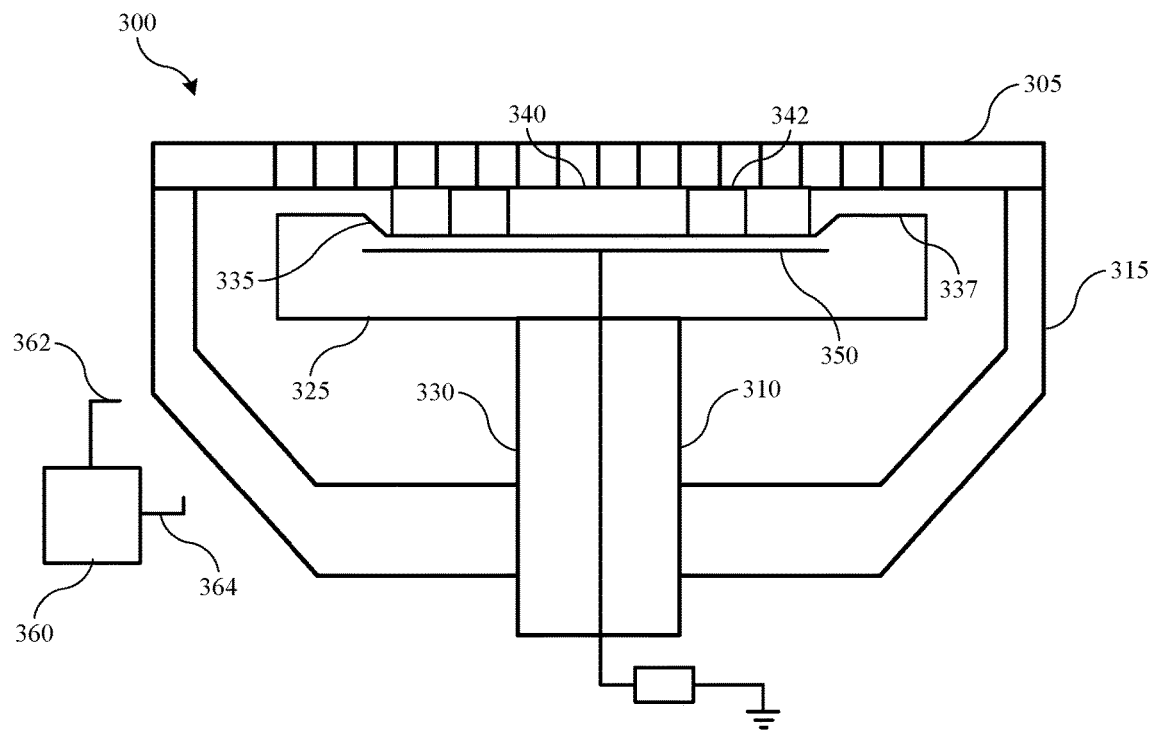
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber during leveling operations according to some embodiments of the present technology. The chamber 300 may be used to perform semiconductor processing operations including deposition, etching, or any other processing as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a faceplate 305, as well as a substrate support assembly 310. Along with chamber sidewalls 315, and the base through which the substrate support may extend that may form part of the chamber body, the faceplate 305 and the substrate support 310 may define a substrate processing region. The substrate support assembly may include a body 325, which may include one or more components embedded or disposed within the body. The components incorporated within the top puck may not be exposed to processing materials in some embodiments, and may be fully retained within the body 325. The substrate support may be any type of substrate support including an electrostatic or vacuum chuck, among any other type of support.

Body 325 may be coupled with a stem 330, which may support the chuck body and may include channels for delivering and receiving electrical and/or fluid lines that may couple with internal components of the body 325 in some embodiments of a substrate support assembly. Within the chuck body may be fluid channels, plasma electrodes, chucking electrodes, vacuum ports, purge ports, heater elements, or any other materials or components that may be associated with a substrate support.

Body 325 may also define a recessed region 335 within the substrate support surface, which may provide a recessed pocket in which a substrate may be disposed. In some embodiments the chuck body may be substantially planar or characterized by other shapes or configurations as well. Recessed region 335 may be formed at an interior region of the top puck and may be configured to receive a substrate for processing. Recessed region 335 may encompass a central region of the body as illustrated, and may be sized to accommodate any variety of substrate sizes. During processing, a substrate may be seated within the recessed region, which may also seat a leveling apparatus 340 during leveling operations. In some embodiments the height of exterior region 337 of the substrate support body may be such that a substrate is level with or recessed below a surface height of the substrate support surface at exterior region 337. Additionally, in some embodiments leveling apparatus 340 may be characterized by a height allowing it to extend above a height of the exterior region 337. In some embodiments, an edge ring may be disposed about a periphery of the top puck, and may at least partially define the recess within which a substrate may be seated. In some embodiments, the surface of the body may be substantially planar, and the edge ring may fully define the recess within which the substrate may be seated. Leveling apparatus 340 may be sized to extend above any component of the pedestal in order to produce a contact surface for the faceplate during leveling.

In some embodiments the body 325 and/or the stem 330 may be conductive materials, although the body may also be insulative or dielectric materials. For example, aluminum, stainless steel, as well as oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as will be explained further below. Exemplary dopant materials may include yttrium, magnesium, silicon, iron, calcium, chromium, sodium, nickel, copper, zinc, or any number of other elements known to be incorporated within a ceramic or dielectric material. Because of the materials that may be incorporated in the body, material effects may occur when the substrate support is heated to processing temperatures. As many conventional leveling devices may be operated at room temperature, the devices may be incapable of accommodating or correcting for drift in parallelism at elevated temperatures.

Electrostatic chuck body 325 may also include an embedded heater 350 contained within the chuck body. Heater 350 may include a resistive heater or a fluid heater in embodiments. The heater 350 may be capable of adjusting temperatures across the body 325, as well as a substrate residing on the substrate support surface. The heater may have a range of operating temperatures to heat the body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1,000° C., or higher. Although conventional leveling devices may be incapable of operating or surviving these temperatures, in some embodiments leveling devices according to embodiments of the present technology may be configured to perform leveling operations at any of these temperature ranges.

Leveling apparatuses according to embodiments of the present technology may incorporate one or more piezoelectric pressure sensors, such as sensors 342 illustrated in FIG. 3. In some embodiments, the sensors 342 may be surface acoustic wave pressure sensors, although any number of sensors operating at least in part on a piezoelectric effect of an incorporated material may be used. As will be explained further below, each sensor may be operated wirelessly by a controller 360. Controller 360 may include a transmitter 362 as well as a receiver 364, which may communicatively couple with the sensors 342 in the leveling device. Because the controller may be disposed outside of the processing chamber, the electronics may not be impacted by the conditions during leveling operations. Any number of controllers 360, or a controller having any number of transmitters and/or receivers, may be used in systems according to the present technology.

For example, transmitter 362 may send signals, such as RF or other signals, to one or more of the sensors 342. The signal may be received by the sensor and a transducer of the sensor may convert the signal to an acoustic wave, for example. This may cause an oscillating effect of the piezoelectric material incorporated within the sensor. An antenna may then transmit this as an output or return signal that may be received by receiver 364. When the leveling apparatus is contacted to or compressed against the faceplate 305, the oscillating signal of each sensor may undergo a phase shift that may be linearly related to a pressure exerted on the sensor. As will be described further below, receiver 364 or controller 360 may then process and/or compare these signals to determine an amount of parallelism between the substrate support and the faceplate.

Figure 4A:
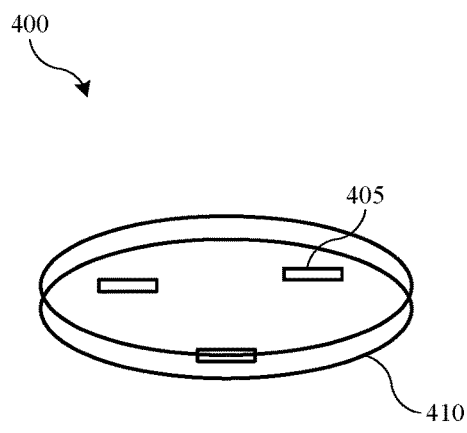
FIGS. 4A-4B show schematic views of an exemplary leveling apparatus according to some embodiments of the present technology.
Figure 4B:
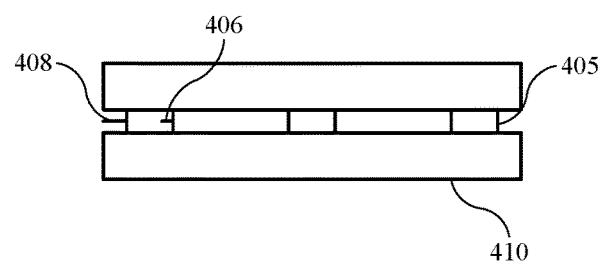

FIGS. 4A-4B show schematic views of an exemplary leveling apparatus 400 according to some embodiments of the present technology. Leveling apparatus 400 may be similar to leveling apparatus 340 described above, and may include any component, feature, or characteristic of leveling apparatus 340, and may illustrate additional features of the apparatus. For example, leveling apparatus 400 may include one or more sensors 405, such as surface acoustic wave sensors, seated between two plates 410. The apparatus may be closed about the plates, although in some embodiments an interior volume may be maintained open as illustrated, which may accommodate pressure changes within a processing chamber relative to the apparatus. Additionally, this may limit temperature conduction between a heated substrate support and an overlying faceplate, which may be maintained at a lower temperature. Sensors 405 may be compressibly coupled between the two plates, whereby compression of the plates may result in operational effects on the sensors, such as a phase shift of a signal produced by the piezoelectric elements, which may be proportional to the pressure applied.

The sensors may include one or more transducers 406, which may convert acoustical waves to electrical signals, and vice versa. The sensors may also include one or more antennas 408, which may send and/or receive signals wirelessly to a controller external to a processing chamber. Exemplary leveling apparatuses may include any number of sensors, including a plurality of sensors that may allow development of a profile across the leveling apparatus. For example, a leveling apparatus may include greater than or about 2, greater than or about 3, greater than or about 4, greater than or about 5, greater than or about 10, greater than or about 20, or more sensors, which may be based on a size of the pedestal or substrate. The leveling apparatus may be sized similar to a substrate, although exemplary apparatuses may be larger than or a smaller than a substrate to be processed in the chamber in which the leveling may be performed. Additionally, although illustrated as circular, in some embodiments the leveling apparatuses may be characterized by any shape or geometry.

Any materials may be used for components of leveling assemblies according to embodiments of the present technology. For example, the sensors may include one or more of lithium niobate, quartz, lithium tantalate, lanthanum gallium silicate, or any other material characterized by a piezoelectric effect. Plates 410 may also include any number of materials, although in some embodiments the materials may be configured to withstand operating conditions within the processing chamber. For example, plates 410 may be any of the materials listed above for substrate support bodies, which may limit a coefficient of thermal expansion disparity between the components when in contact. As one non-limiting example, plates 410 may be aluminum nitride or some other ceramic, including any material previously noted, which may be capable of withstanding any of the temperatures previously described, and thus may maintain structural integrity during leveling operations.

For example, if plates 410 lose rigidity at high temperature, leveling operations may be compromised. Accordingly, in some embodiments the plates 410 may be a thickness greater than or about 100 mils or more, and may be a ceramic or other material that may maintain rigidity at any of the substrate temperatures as described above. Plates 410 may be the same material in embodiments, although in some embodiments the plates 410 may be a different material from one another, such as the same material as the chamber component to which the plate may be placed in contact. For example, one plate may be a similar material or compatible material with the substrate support body, while the other plate may be a similar material or compatible material with the faceplate.

Figure 5:
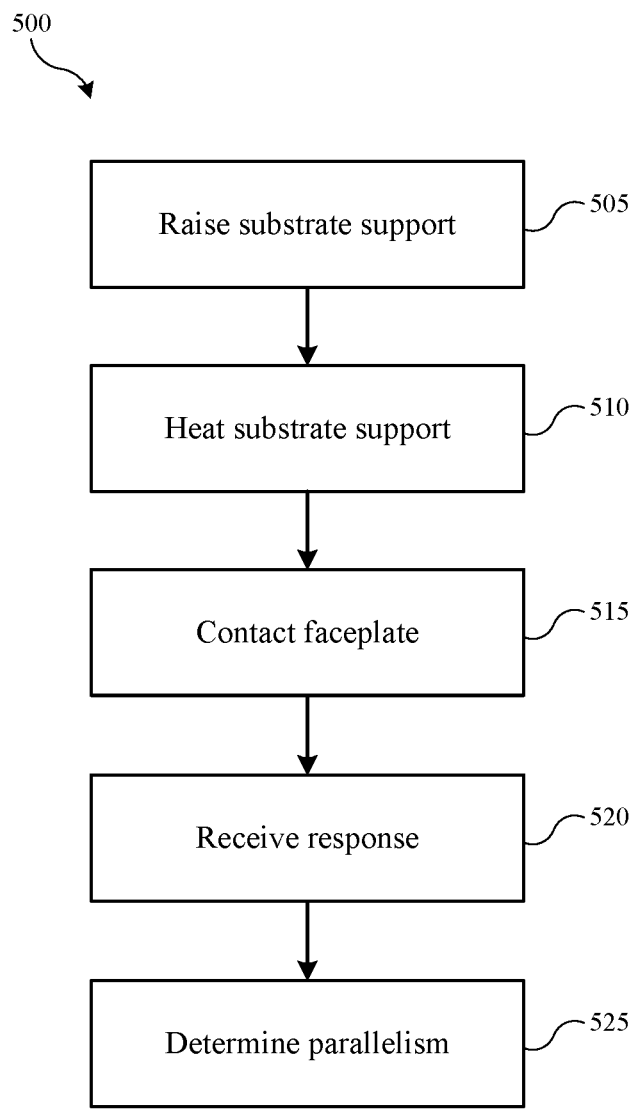
FIG. 5 shows exemplary operations in a method according to some embodiments of the present technology.

The chamber and components discussed previously may be used in performing exemplary methods including leveling methods. Turning to FIG. 5 is shown exemplary operations in a method 500 according to embodiments of the present technology. Method 500 may include one or more operations prior to the initiation of the method, including chamber cleaning or any other maintenance operations. The method may include a number of optional operations, which may or may not be specifically associated with some embodiments of methods according to the present technology. For example, many of the operations are described in order to provide a broader scope of the processes performed, but are not critical to the technology, or may be performed by alternative methodology as will be discussed further below.

Method 500 may be related to performing a leveling operation within a semiconductor processing chamber, which may be performed utilizing a leveling apparatus including any feature or component as previously described. For example, a leveling apparatus may be positioned within a chamber, such as seated on a pedestal or substrate support. With the leveling apparatus, the substrate support may be raised at operation 505 to a position proximate a faceplate. In some embodiments the substrate support may be heated at operation 510 to any temperature as previously identified or described. It is to be understood that operation 510 may occur prior to operation 505, or concurrently with operation 505, in some embodiments of the present technology. Additionally, in some embodiments a vacuum may be drawn on the processing chamber to any pressure level at which substrate processing may be performed. The substrate support may be raised to a height at which the leveling apparatus may contact the faceplate at operation 515, and in some embodiments may at least partially compress the leveling apparatus between the faceplate and the substrate support.

A receiver, which may be part of a controller, may receive a response as previously described from one or more sensors of the leveling apparatus at operation 520. For example, as explained above, sensors within the leveling apparatus may be or include surface acoustic wave sensors including a piezoelectric material. At any time during the method, a transmitter may provide a signal to the sensors, which may cause an oscillation to be produced at some frequency by a transducer of the sensor, and which may then be communicated back to the receiver from an antenna of the sensor. When a sensor is compressed between the faceplate and the substrate support, a pressure may be applied to the sensor, which may cause a shift of the oscillation frequency of the sensor, which may be proportional, including linearly proportional, to an applied pressure. The controller may then determine a parallelism at operation 525 between the surface of the pedestal on which the leveling apparatus is seated, and a faceplate against which the leveling apparatus is disposed.

Determining parallelism may be performed in any number of ways based on received signals from the sensors. For example, based on the amount of compression caused by a height of the pedestals, a threshold pressure may be applied to the sensors. If this difference from a baseline is not equal to a predetermined pressure, the substrate support may be off from parallel. For example, if the pressure is higher than the predetermined pressure associated with an amount of compression based on a pedestal height, then that area of the pedestal may be higher than another area, where the pressure is lower. Additionally, sensors may be compared to one another to ensure that a frequency shift associated with an applied pressure may be the same across each of the sensors. For example, if one sensor has a phase shift that is less than other sensors, the applied pressure may be less, indicating a height that is lower than other locations across the substrate support. Accordingly, by comparing phase shift values to a database value or to other sensor values for equivalence, a determination may be made whether the substrate support is parallel with the faceplate. Adjustments to the substrate support may be made if needed, followed by additional level testing. Once sufficient parallelism has been achieved, subsequent processing may then be performed with greater confidence because the leveling operation may have been performed at similar processing conditions. Consequently, by utilizing leveling apparatuses according to embodiments of the present technology, leveling may be performed at similar chamber conditions as processing to be performed, which may increase accuracy of leveling operations over conventional technologies.

One or more computing devices or components may be adapted to provide some of the desired functionality described herein by accessing software instructions rendered in a computer-readable form. The computing devices may process or access signals for operation of one or more of the components of the present technology, such as the receiver or controller, for example. When software is used, any suitable programming, scripting, or other type of language or combinations of languages may be used to perform the processes described. However, software need not be used exclusively, or at all. For example, some embodiments of the present technology described above may also be implemented by hard-wired logic or other circuitry, including but not limited to application-specific circuits. Combinations of computer-executed software and hard-wired logic or other circuitry may be suitable as well.

Some embodiments of the present technology may be executed by one or more suitable computing device adapted to perform one or more operations discussed previously. As noted above, such devices may access one or more computer-readable media that embody computer-readable instructions which, when executed by at least one processor that may be incorporated in the devices, cause the at least one processor to implement one or more aspects of the present technology. Additionally or alternatively, the computing devices may comprise circuitry that renders the devices operative to implement one or more of the methods or operations described.

Any suitable computer-readable medium or media may be used to implement or practice one or more aspects of the present technology, including but not limited to, diskettes, drives, and other magnetic-based storage media, optical storage media, including disks such as CD-ROMS, DVD-ROMS, or variants thereof, flash, RAM, ROM, and other memory devices, and the like.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing system comprising:
   a chamber body comprising sidewalls and a base, the chamber body defining an interior volume;
   a substrate support extending through the base of the chamber body, wherein the substrate support is configured to support a substrate within the interior volume;
   a faceplate positioned within the interior volume of the chamber body, wherein the faceplate defines a plurality of apertures through the faceplate; and
   a leveling apparatus seated on the substrate support, wherein the leveling apparatus comprises a plurality of piezoelectric pressure sensors compressibly coupled between two plates of the leveling apparatus, wherein the leveling apparatus is configured to identify parallelism between the substrate support and the faceplate when the leveling apparatus is contacted or compressed against the faceplate by the substrate support.

2. The semiconductor processing system of claim 1, wherein each sensor of the plurality of piezoelectric pressure sensors comprise an antenna.

3. The semiconductor processing system of claim 2, further comprising:
   a transmitter disposed outside of the chamber body and configured to transmit an input signal to a transducer of each of the plurality of piezoelectric pressure sensors.

4. The semiconductor processing system of claim 3, further comprising:
   at least one receiver disposed outside of the chamber body and configured to receive an output signal from an antenna of each of the plurality of piezoelectric pressure sensors.

5. The semiconductor processing system of claim 4, wherein the receiver is configured to compare an oscillation frequency shift of each sensor of the plurality of piezoelectric pressure sensors.

6. The semiconductor processing system of claim 1, wherein the leveling apparatus comprises at least two piezoelectric pressure sensors compressibly coupled between two plates of the leveling apparatus.

7. The semiconductor processing system of claim 1, wherein the piezoelectric pressure sensors comprise surface acoustic wave pressure sensors.

* * * * *